United States Patent [19]

Jin et al.

[11] Patent Number: 5,512,818
[45] Date of Patent: Apr. 30, 1996

[54] VOLTAGE PROPORTIONAL REPLICATION DEVICE USING MAGNETORESISTIVE SENSING ELEMENTS

[75] Inventors: Sungho Jin, Millington, N.J.; Ashraf W. Lotfi, Mesquite, Tex.; Mark T. McCormack, Summit, N.J.

[73] Assignee: AT&T Corp., Murray Hill, N.J.

[21] Appl. No.: 220,768

[22] Filed: Mar. 31, 1994

[51] Int. Cl.⁶ .................................................. G01V 3/06
[52] U.S. Cl. .................................. 323/368; 323/362
[58] Field of Search ............................... 323/362, 369, 323/368; 361/154, 159

[56] References Cited

U.S. PATENT DOCUMENTS

| | | | |
|---|---|---|---|
| 2,852,732 | 3/1955 | Weiss | 323/94 |
| 2,885,629 | 9/1955 | Tschermak | 323/74 |
| 3,649,912 | 3/1972 | Nakamura | 324/127 |
| 3,931,566 | 1/1976 | Pask et al. | 323/4 |
| 4,075,671 | 2/1987 | Cheatham et al. | 360/113 |
| 4,596,950 | 6/1986 | Lienhard et al. | 324/117 R |
| 5,008,612 | 4/1991 | Otto | 324/117 X |

OTHER PUBLICATIONS

P. M. Levy, "Giant Magnetoresistance In Magnetic Layered and Granular Materials" *Science*, vol. 256, pp. 972–973 15 May 1992.

E. F. Fulleron, "150% magnetoresistance in sputtered Fe/Cr(100) superlattices" *Applied Physics Letters*, vol. 63, pp. 1699–1701 20 Sep. 1993.

T. L. Hylton, "Giant Magnetoresistance at Low Fields in Discontinuous NiFe–Ag Multilayer Thin Films" *Science*, vol. 261, 20 Aug. 1993, pp. 1021–1024.

*Primary Examiner*—Peter S. Wong
*Assistant Examiner*—Shawn Riley
*Attorney, Agent, or Firm*—Glen E. Books

[57] ABSTRACT

In accordance with the present invention, a voltage proportional replication device comprises an input electromagnet responsive to an input voltage for producing a magnetic field in proportion to the input voltage; and a first magnetoresistive sensing element disposed within the field of the input electromagnet. The device further includes an adjustable source of output voltage; an output electromagnet responsive to the output voltage for producing a magnetic field in proportion to the output voltage; and a second magnetoresistive sensing element disposed within the field of the output electromagnet. A control circuit for controlling the adjustable output voltage maintains a constant ratio between the resistances of the first and second magnetoresistive elements, thereby maintaining a constant ratio between the input voltage and the output voltage.

14 Claims, 5 Drawing Sheets

VOLTAGE PROPORTIONAL REPLICATION DEVICE USING MAGNETORESISTIVE SENSING ELEMENTS

FIELD OF THE INVENTION

This invention relates to voltage proportional replicating devices capable of proportionally replicating a changing voltage while providing isolation. Specifically, it relates to a proportional voltage replicating device employing magnetoresistive sensing elements.

BACKGROUND OF THE INVENTION

In order to provide feedback control in the closed-loop regulation of power converters, DC and AC information must be conveyed across a high-voltage to low-voltage isolation boundary so that the output voltage is maintained constant even though the input voltage might fluctuate. Voltage replication devices are needed to convey the output voltage information to the control element in such converters. This voltage information is usually provided by an opto-coupler which provides a reproduction of the DC and AC current wave form through infrared light from a light emitting diode (LED). The light is sent to a photo-transistor to provide feedback and control the output voltage. The LED and the photo-transistor are optically coupled by a transparent medium.

Conventional opto-couplers, however, have a number of shortcomings that limit their usefulness and reliability. They are useful for only a relatively low bandwidth, typically less than about 40 KHz. Their relatively low reliability in high temperature environments necessitates the use of stronger bias currents, which result in the degradation of the transparent medium. Undesirable variation in properties and performance from one device to another is also a problem. Accordingly, there is a need for a voltage replication device which can be operated in a wider bandwidth and has a simpler design to minimize variation from one device to another.

SUMMARY OF THE INVENTION

In accordance with the present invention, a voltage proportional replication device comprises an input electromagnet responsive to an input voltage for producing a magnetic field in proportion to the input voltage; and a first magnetoresistive sensing element disposed within the field of the input electromagnet. The device further includes an adjustable source of output voltage; an output electromagnet responsive to the output voltage for producing a magnetic field in proportion to the output voltage; and a second magnetoresistive sensing element disposed within the field of the output electromagnet. A control circuit for controlling the adjustable output voltage maintains a constant ratio between the resistances of the first and second magnetoresistive elements, thereby maintaining a constant ratio between the input voltage and the output voltage.

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

It is to be understood that these drawings are for purposes of illustrating the concepts of the invention and, except for graphical illustrations, are not to scale.

DETAILED DESCRIPTION

A brief description of magnetoresistance and magnetoresistive materials is useful in understanding the invention. The "magnetoresistance" (MR) of a material is the resistance $R(H)$ of the material in an applied field H less the resistance $R_o$ in the absence of an applied field, i.e. $MR=R(H)-R_o$. The resistance difference MR is typically normalized, by dividing by $R(H)$ and expressed as a MR ratio in percent:

$$MR \text{ ratio} = (R(H) - R_o)/R(H)$$

Conventional magnetic materials (e.g., permalloy) typically have a positive MR ratio of a few percent. Recently, relatively large values of MR ratio were observed in metallic multilayer structures, e.g. Fe/Cr or Cu/Co. See, for instance, P. M. Levy, *Science*, Vol. 256, p. 972 (1992), E. F. Fullerton, *Applied Physics Letters*, Vol. 63, p. 1699 (1993), and T. L. Hylton, *Science*, Vol. 265, p. 1021 (1993). More recently still, much higher MR ratios were observed by applicant Jin and co-workers in tin oxide films of lanthanum-manganites. See, for example, the co-pending United States patent application by S. Jin et al., Ser. No. 08/154,766 filed on Nov. 18, 1993 entitled "Article Comprising Magnetoresistive Material"; Ser. No. 08/176,366 filed on Dec. 30, 1993 entitled "Magnetoresistive Current Sensor Having High Sensitivity"; and Ser. No. 08/187,668 filed on Jan. 26, 1994 entitled "Article Comprising Improved Magnetoresistive Material". These three applications are incorporated herein by reference. The manganite films exhibit advantageous characteristics of very large magnetoresistance in combination with relatively higher electrical resistivity than metallic MR materials so that the output voltage signal $\Delta V$ is large.

Figure 1:
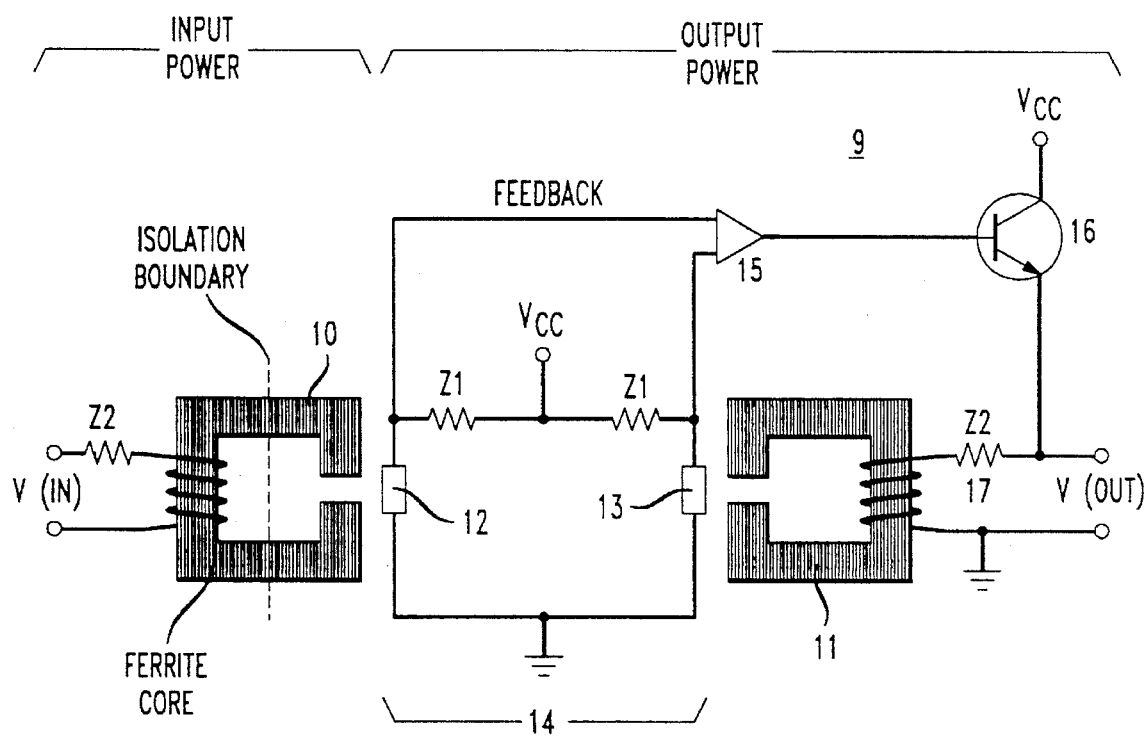
FIG. 1 schematically illustrates a device for replicating an input voltage at an isolated voltage output.

Turning now to the use of such materials in a voltage replication device, FIG. 1 schematically illustrates a voltage replicating device 9 comprising an input electromagnet 10 responsive to an input voltage $V_{in}$ for producing a magnetic field in proportion to $V_{in}$ and an output electromagnet 11 responsive to an output voltage $V_{out}$. An input magnetoresistive sensing element 12 is disposed adjacent the gap of input magnet 10 for sensing the field produced by the magnet, and an output magnetoresistive sensing element 13 is disposed adjacent the gap of output magnet 11. The output voltage $V_{out}$ is controlled to maintain a constant ratio (including equality) between the resistance of sensing elements 12 and 13. This control is preferably accomplished by a control circuit formed disposing sensing elements 12 and 13 in separate arms of a bridge circuit 14 and applying the voltage drops across elements 12 and 13 to the input terminals of a differential amplifier 15 controlling the output voltage from source $V_{cc}$ via transistor 16 and output resistor 17. In this arrangement, an increase in $V_{in}$ produces an increase in the field of magnet 10 which, in turn, increases the resistance of element 12 and the voltage drop across it. The voltage drop drives the differential amplifier 15 to increase the output current and voltage until the resistance in sensing element 13 equals that in element 12. Thus $V_{out}$ will be in proportion to $V_{in}$. If the electromagnets, sensing elements, and bridge resistors are matched, $V_{out}$ will equal $V_{in}$. Advantageously, the sensing elements are thermally coupled with the windings in the respective electromagnets.

The input voltage can be AC, DC or AC superimposed on DC. The device is particularly advantageous where the input includes an AC component at a frequency greater than 10 KHz, and it operates at AC frequencies greater than 50 KHz which are beyond conventional opto-couplers.

Figure 2:
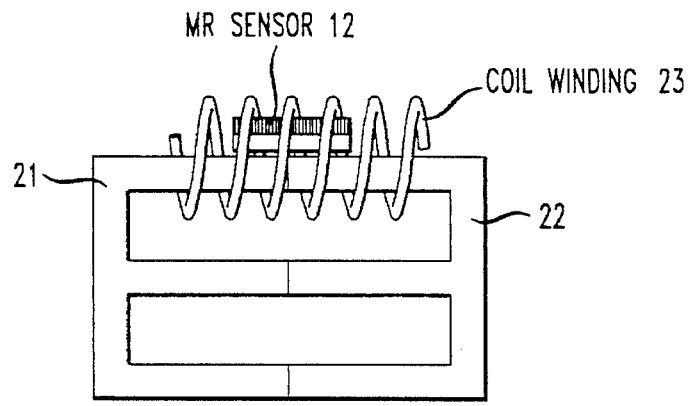
FIG. 2 schematically illustrates a preferred arrangement for locating a magnetoresistive sensing element in relation to an electromagnet.

FIG. 2 illustrates a preferred arrangement for locating a magnetoresistive sensing element (12 or 13) in relation to an electromagnet (10 or 11). Two soft magnetic, Mn—Zn ferrite E-type cores 21 and 22 form a closed magnetic loop, and coil 23 is wound around one edge. The overall dimension of a typical double-core assembly is 1.5" wide×1" high and ¼" thick.

A small sensing element, e.g. 12, is mounted within the coil 23 on one edge of the ferrite core. Element 23 can preferably comprise a 3 mm×4 mm×1000 Å thin film of $La_{0.25}Ca_{0.55}Sr_{0.08}MnO_n$ magnetoresistive material on a 1 mm thick $LaAlO_3$ substrate. The film can advantageously be prepared by pulsed laser deposition in a 100 m Torr partial oxygen atmosphere and heat treatment at 950° C. for 3 h in a 3 atmosphere oxygen environment. Such a film exhibited a magnetoresistance ratio at room temperature of 1.2% at a field of 500 Oe.

The sensing element 12 can be operated either as a four-terminal device or as a two-terminal device. In the four-terminal mode, two wires (not shown) are used for supplying a constant current and two (not shown) are used for the measurement of voltage signal from the sensing element. In the two-terminal mode, only two lead wires are used for the measurement of voltage signal from the sensing element. The element 12 responds to the change in the magnetic field caused by the voltage applied to the coil winding 23. The inductively generated voltage is superimposed upon the magnetoresistively generated voltage to give the overall voltage signal. The two-terminal device can be viewed as a half-turn secondary coil. It generally produces a smaller signal than the four-terminal device but has the advantage of being simpler and requiring no power supply to the sensing element.

Figure 3:
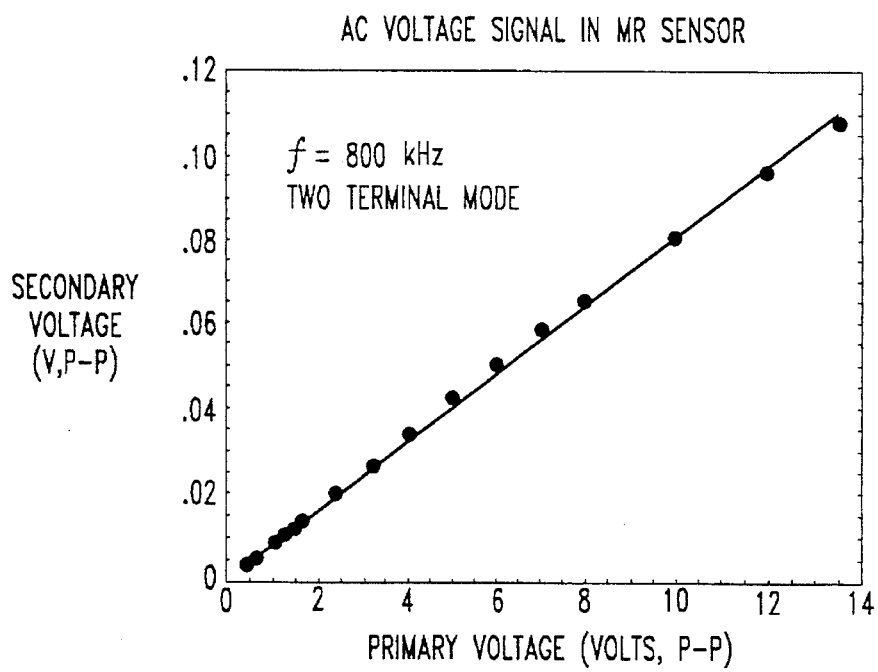
FIG. 3 is a plot of the AC voltage signal in a two-terminal magnetoresistive sensor vs in the input AC voltage in a coil at a constant frequency of 800 KHz.

In operation, the coil winding was fed input (primary) voltage and the voltage signal (secondary voltage) in the sensing element was measured. FIG. 3 is a plot of the AC voltage signal in the two-terminal sensing element as a function of the primary (input) voltage at a frequency of 800 KHz. The sensing element voltage signal is substantial. Moreover it increases linearly with the input voltage, a desirable feature for the sensor.

Figure 4:
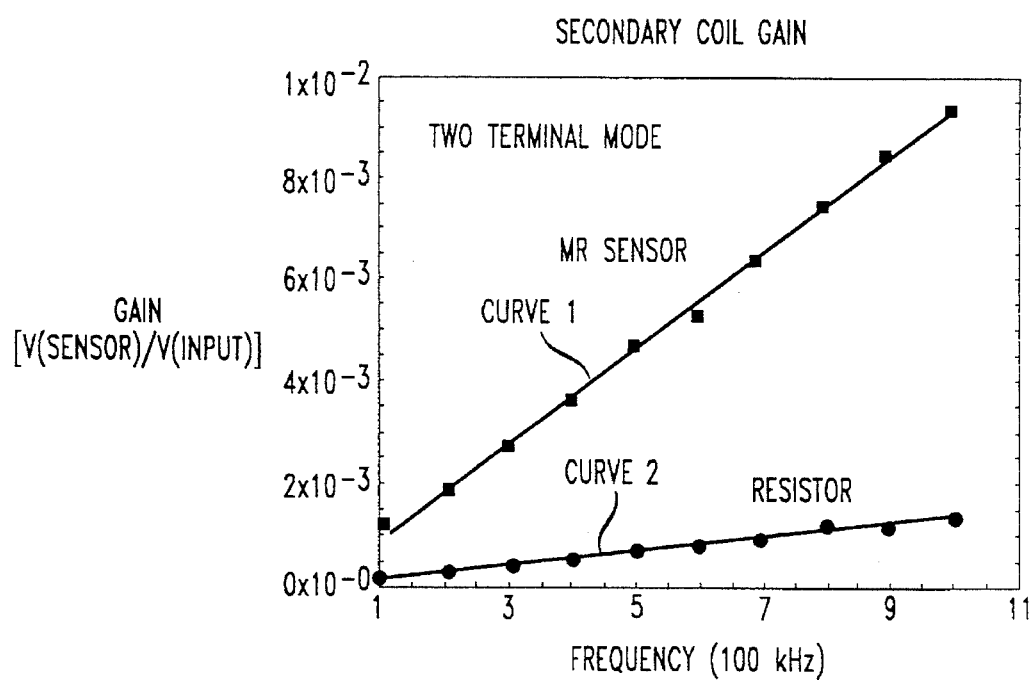
FIG. 4 is a plot of the AC voltage signal from a magnetoresistive sensor (expressed as a fraction of the input voltage) vs frequency of the input voltage.

FIG. 4 shows in curve 1 the frequency dependence of the secondary transformer (sensing element) gain expressed as a ratio of V (Sensor)/V (Input). In the frequency range of 100 KHz to 1 MHz, the transformer gain is essentially linear with the frequency increase. Also shown for comparison is a dotted curve 2 which represents a gain from a resistor having the same electrical resistance (680Ω) as the sensing element. The signal from the sensing element is substantially higher than the resistor.

Figure 5:
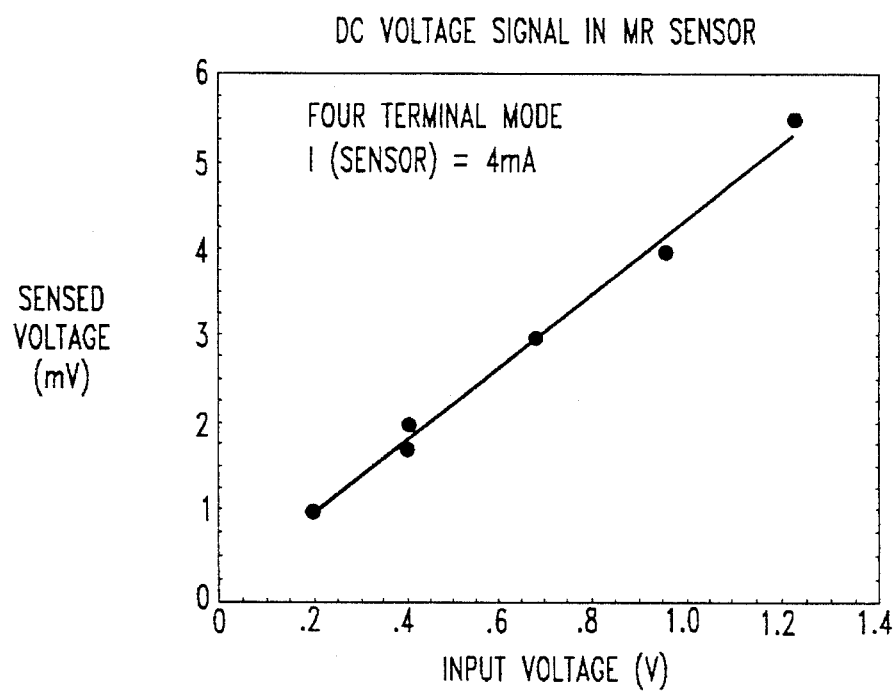
FIG. 5 is a DC voltage signal from a magnetoresistive sensor vs the input voltage in the coil.

FIG. 5 is a DC voltage signal from a four-terminal sensing element placed in the primary coil as in FIG. 2, except that a small gap of 0.005" width was added between the two mating E-cores to provide some leakage magnetic flux to the MR sensor. Also two small pieces of Mn—Zn ferrite (2×3×3 mm size) were placed on both sides of the 3 mm wide sensing element for additional field amplification. A small and constant DC current of 4 mA was supplied to the sensing element. As shown in FIG. 5, the DC voltage signal from the MR sensor is linear with the input voltage in the primary winding.

Figure 6:
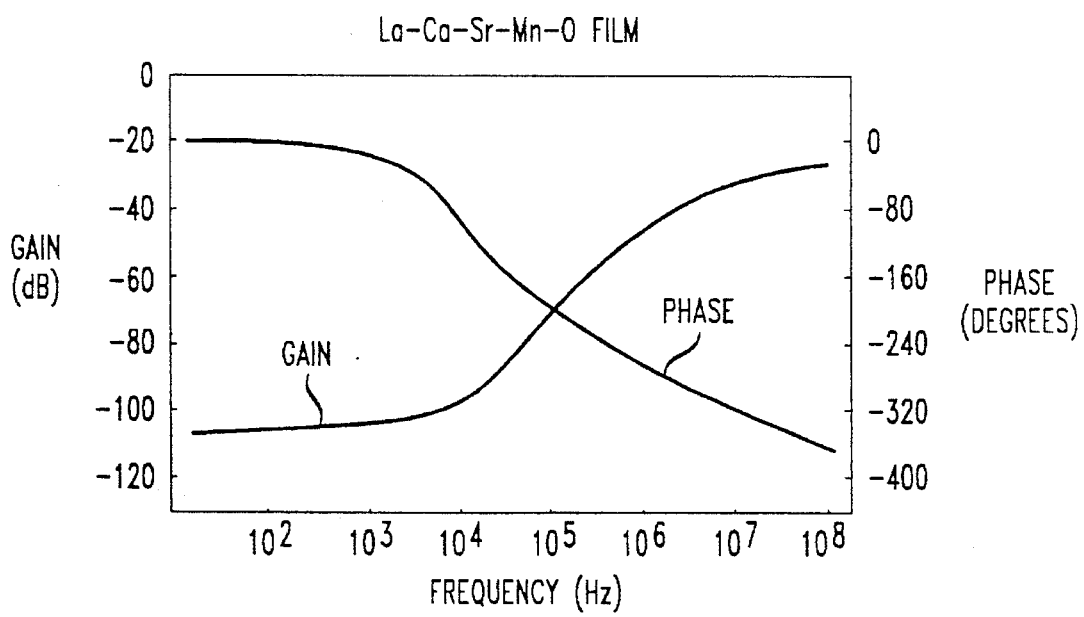
FIG. 6 shows the gain and the phase change in a La—Ca—Sr—Mn—O magnetoresistive film upon high frequency AC excitation.
Figure 7:
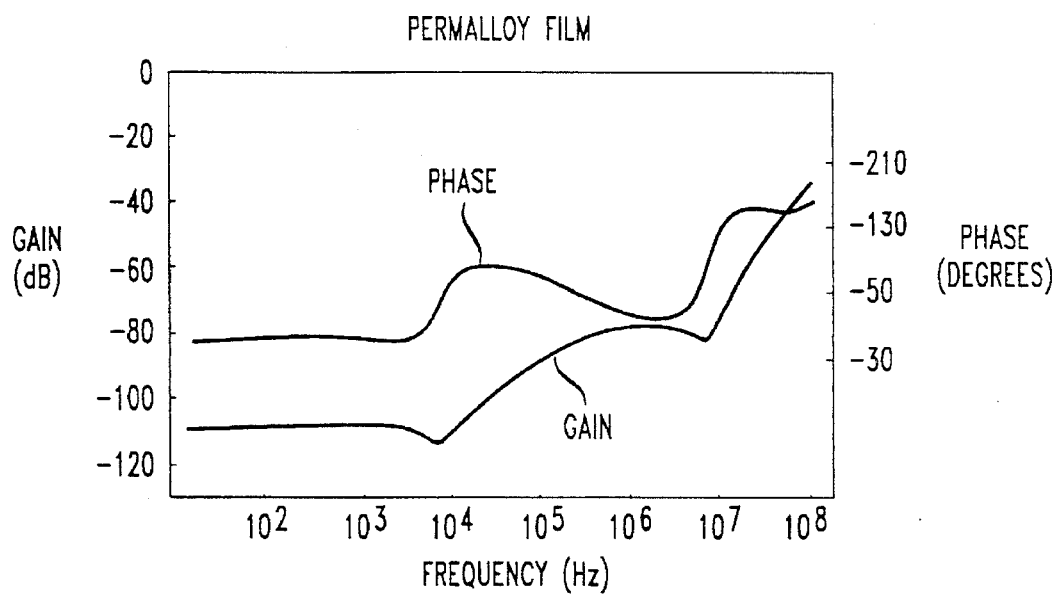
FIG. 7 shows the gain and the phase change in a permalloy film upon high frequency AC excitation.
Figure 8:
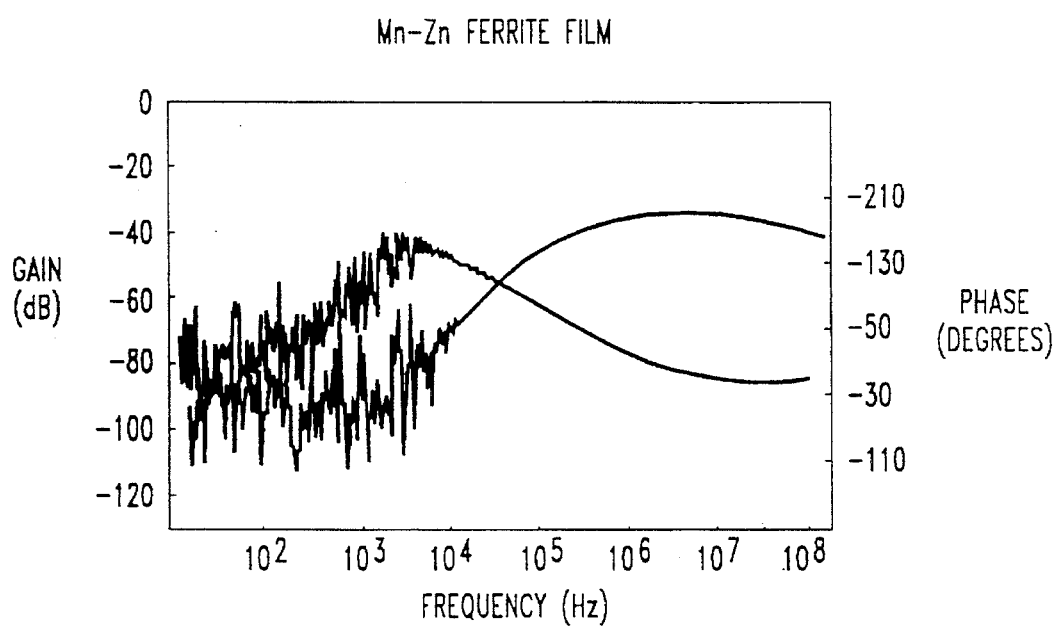
FIG. 8 shows the gain and the phase in the Mn—Zn ferrite film upon high frequency AC excitation.

The AC voltage sensing characteristics of the magnetoresistive sensing element was investigated in a wider range of frequencies from 10 Hz to 100 MHz in a two-terminal mode and compared with two other prominent soft ferromagnetic thin films, i.e., permalloy (79 Ni-4 Mo-17 Fe) and Mn—Zn ferrite under identical measurement conditions. The permalloy was 2000 Å thick, 3×3.4 mm in size, and was deposited on a fused quartz substrate. The electrical resistance was 3.6Ω. The Mn—Zn ferrite was 2500 Å thick, 2.6×5 mm in size, and was deposited on a yttria-stabilized zirconia substrate. It had a resistance 396 KΩ. No current flow to the sensors was used. The input impedance in the test channel was 1 MΩ, much higher than that in the sensing element (R=760Ω). The sensor signals for the three materials are shown in FIGS. 6–8. The voltage signal gain in the sensor, V (secondary)/V (primary), is expressed in terms of decibels (dB) ($20 \times \log_{10}$ of the voltage ratio). The phase shifts in the sensor signals are also shown.

As is evident in FIG. 6, the magnetoresistive sensing element of La—Ca—Sr—Mn—O film gives useful signals (gains) over a wide range of $10^3$ to $10^8$ Hz. This is a desirable feature for a wide bandwidth ac field sensor as well as for a power converter. The gain increases with frequency. It is substantial, especially near or above 1 MHz. These high frequency level AC signals cannot be handled by present-day opto-couplers for voltage replication and regulation.

The permalloy film on the other hand exhibits gain and phase which jump through the frequency range as shown in FIG. 7. The Mn—Zn ferrite film exhibits considerable noise in the low frequency region in both the gain and phase. These AC characteristics are not desirable features for use in the voltage replication devices.

Advantageously the magnetorestrictive material has a high MR ratio of at least 0.1% at a field of 500 Oe and preferably is at least 0.5%. In a preferred embodiment, the magnetoresistive film is a compound of the form $A_wB_xC_yO_z$ where A is chosen from one or more rare earth elements (La, Y, Ce, Nd, Sin, En, Tb, Dy, Ho, Er, Tm, Yb, and Lu), B is chosen from one or more group IIa elements of the periodic table (Mg, Ca, Sr, and Ba), or other elements such as Pb or Cd, and C is chosen from Cr, Mn, Fe, and Co. Advantageously, $0.4 \leq w \leq 0.9$, $0.1 \leq x \leq 0.6$, $0.7 \leq y \leq 1.5$, and $2.5 \leq Z \leq 3.5$. Preferably, $0.5 \leq W \leq 0.8$, $0.15 \leq x \leq 0.5$, $0.8 \leq y \leq 1.2$, and $2.7 \leq Z \leq 3.3$. In a preferred compound, A is La, B is Ca, Sr, Ba, Pb or their mixture, C is Mn.

The magnetoresistive sensor material can be in the form of epitaxial or non-epitaxial thin films prepared by physical deposition such as laser ablation, sputtering, evaporation, MBE (molecular beam epitaxy) or by chemical deposition such as electroless, electrolytic or chemical vapor deposition or other techniques such as plasma spray or screen printing. Alternatively, thick films or bulk materials can also be used if a sufficiently high signal can be obtained.

Fabrication of preferred magnetoresistive material is described in detail in the co-pending U.S. patent application Ser. No. 08/154,766 and Ser. No. 08/187,668, both of which are incorporated herein by reference. A preferred composition layer can be made as follows. A 1000 Å thick layer of nominal composition $La_{0.55}Ca_{0.25}Sr_{0.08}MnO_x$ is deposited on a (100) $LaAlO_3$ substrate by pulsed laser ablation using a 12 mm diameter×5 mm thick target of the same composition. The pulsed laser deposition is carried out in a partial oxygen atmosphere of 100 mTorr with the substrate temperature of 650°–700° C. The film is subsequently heat treated at 950° C. for 3 hours in 3 atmosphere oxygen environment. Other insulating substrates such as $SrTiO_3$ and MgO may also be used. It is preferable to have some epitaxy or at least some c-axis texture for higher MR ratio in the film. Other non-lattice matching substrates such as $Al_2O_3$ or Si may also be used, preferably with a suitable buffer layer added for epitaxy or electrical insulation purpose.

Figure 9:
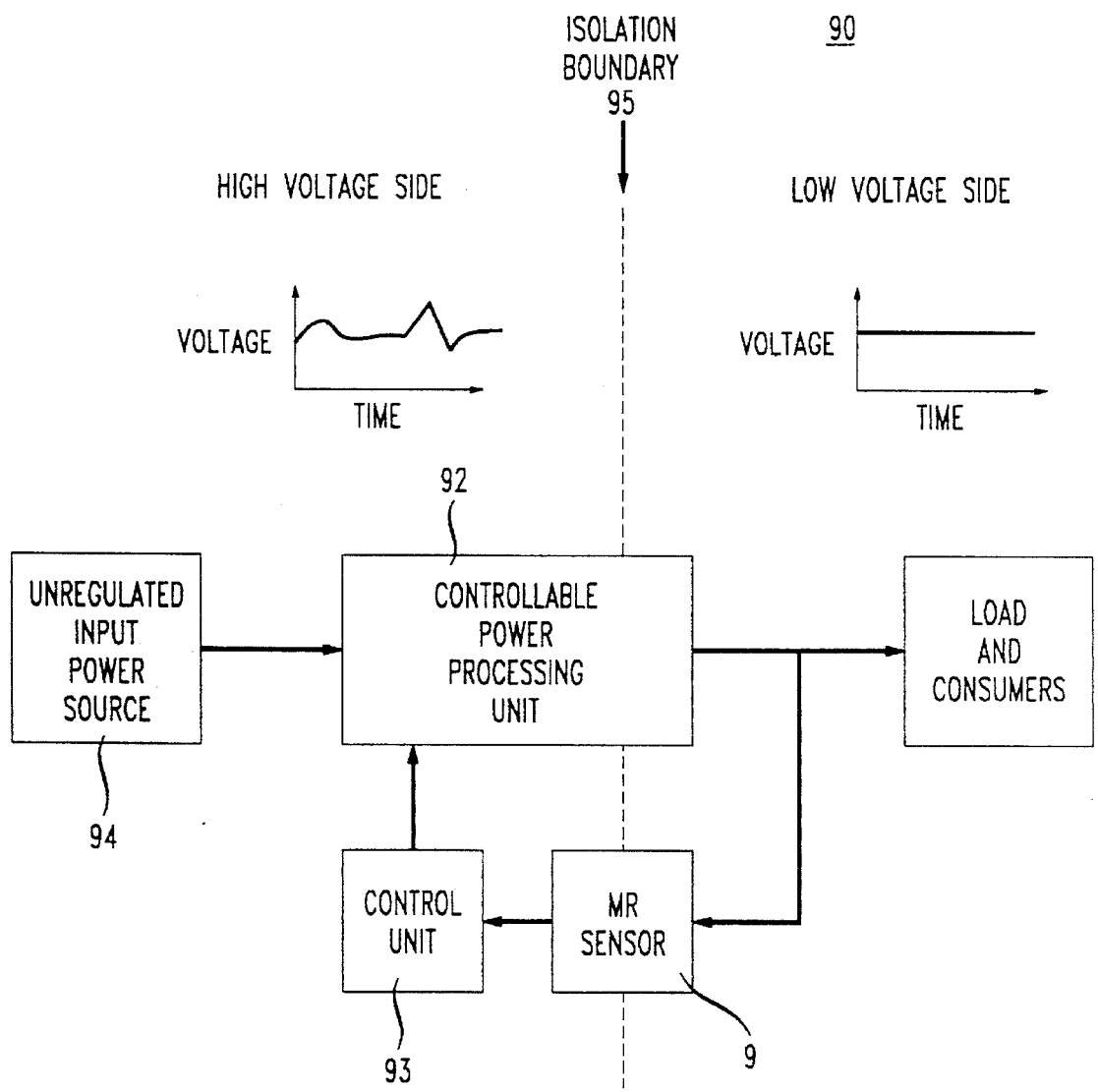
FIG. 9 is a schematic diagram of power converter using the device of FIG. 1 in the feedback control circuit.

FIG. 9 is a schematic block diagram of a power converter system 90 using a voltage proportional replicating device 9 in the feedback loop 91 from the output of a controllable power processing unit 92 to the control unit 93. In essence the system 90, which is conventional except for device 9, receives unregulated, high voltage input power from source 94 and converts it into lower voltage regulated power at the output of unit 92. The isolation boundary 95 represents the physical isolation which must be maintained between the high and low voltage sides of the system. Device 9, which is the device described in FIG. 1, provides information to the control unit 93 concerning the output, so that the control unit can maintain the output constant under input variations.

While one use of the FIG. 1 voltage proportional replicating device is in the feedback loop controlling circuit of an isolated power converter, the device can also be used for other closed loop control applications such as circuits for controlling motor drives (speed or torque), wideband amplifiers, electronic ballasts as for control of fluorescent lights, and automotive electronics, such as ignition circuits.

While the invention has been described in relation to a preferred magnetoresistive material, more generally the sensor material can be any magnetoresistive material, preferably with high electrical resistivity ($\rho > 0.2$ mΩ·cm and preferably $\rho > 1$ mΩ·cm). Such a high electrical resistivity is advantageous for high sensing voltage output at a low input power.

We claim:

1. A voltage proportional replicating device comprising an input electromagnet responsive to an input voltage for producing a magnetic field in proportion to said input voltage;

a first magnetoresistive sensing element disposed within the field of said input electromagnet;

an adjustable source of output voltage;

an output electromagnet responsive to said output voltage for producing a magnetic field in proportion to said output voltage;

a second magnetoresistive sensing element disposed within the field of said output electromagnet, at least one of said first and second magnetoresistive sensing elements comprising a compound of the form $A_wB_xC_yO_z$ where A comprises one or more rare earth elements, B comprises one or more elements chosen from the group consisting of Mg, Ca, Sr, Ba, Pb and Cd and C is one or more elements from the group consisting of Cr, Mn, Fe and Co, said at least one sensing elements responsive to ac voltages over the range $10^3$ to $10^8$ Hz; and a control circuit for controlling said adjustable output voltage to maintain a constant ratio between the resistances of said first and second magnetoresistive elements, thereby maintaining a constant ratio between said input voltage and said output voltage.

2. A device according to claim 1 wherein said constant ratio is unity.

3. A device according to claim 1 wherein said control circuit comprises a transistor for controlling the current from a power supply and a differential amplifier for controlling said transistor, said differential amplifier responsive to the difference in voltage drop across said first and second sensing elements.

4. A device according to claim 1 further comprising a circuit for applying current through at least one of said magnetoresistive sensing elements.

5. The device of claim 1 wherein $0.4 \leq w \leq 0.9$, $0.1 \leq x \leq 0.6$, $0.7 \leq y \leq 1.5$ and $2.5 \leq z \leq 3.5$.

6. The device of claim 1 wherein $0.5 \leq w \leq 0.8$, $0.15 \leq x \leq 0.5$, $0.8 \leq y \leq 1.2$ and $2.7 \leq z \leq 3.3$.

7. The device of claim 1 wherein A is La, B is one or more elements from the group consisting of Ca, Sr, Ba, or Pb and C is Mn.

8. The device of claim 1 wherein at least one of said magnetoresistive sensing elements comprises a body of magnetoresistive material having electrical resistivity $\rho > 0.2$ mΩ·cm.

9. The device of claim 1 wherein at least one of said magnetoresistive sensing elements comprises a body of magnetoresistive material having electrical resistivity $\rho > 5$ mΩ·cm.

10. The device of claim 1 wherein said input voltage has an AC component in excess of 10 KHz.

11. The device of claim 1 wherein said input voltage has an AC component in excess of 50 KHz.

12. The device of claim 1 wherein at least one of said magnetoresistive elements has a magnetoresistance ratio of at least 0.1% at a field of 500 Oe.

13. The device of claim 1 wherein at least one of said magnetoresistive elements has a magnetoresistance ratio of at least 0.5% at a field of 500 Oe.

14. A power converter having a feedback control circuit for closed-loop regulation comprising a device according to claims 1 or 2 or 3 or 4 or 5 or 6 or 7 or 8 or 9 or 10 or 11 or 12 or 13.

* * * * *